United States Patent
Fratti et al.

(10) Patent No.: US 7,505,495 B2
(45) Date of Patent: Mar. 17, 2009

(54) OPTICAL ASSEMBLY COMPRISING MULTIPLE SEMICONDUCTOR OPTICAL DEVICES AND AN ACTIVE COOLING DEVICE

(75) Inventors: Roger A. Fratti, Mohnton, PA (US); Joseph Michael Freund, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 117 days.

(21) Appl. No.: 11/323,758

(22) Filed: Dec. 30, 2005

(65) Prior Publication Data

US 2007/0153848 A1    Jul. 5, 2007

(51) Int. Cl.
*H01S 5/024* (2006.01)

(52) U.S. Cl. ............... 372/34; 372/50.12; 372/50.121; 372/50.122; 372/23

(58) Field of Classification Search ............ 372/34, 372/23, 50.12
See application file for complete search history.

(56) References Cited

U.S. PATENT DOCUMENTS

| 5,084,886 | A * | 1/1992 | Martin ............... 372/36 |
| 6,512,291 | B2 | 1/2003 | Dautartas et al. |
| 6,514,791 | B2 | 2/2003 | Dautartas et al. |
| 6,555,413 | B1 | 4/2003 | Freund et al. |
| 6,676,306 | B2 * | 1/2004 | Ikeda et al. ............. 385/112 |
| 7,081,712 | B2 * | 7/2006 | Saedi et al. ............. 315/112 |
| 2002/0167978 | A1 * | 11/2002 | Nomoto ................ 372/36 |
| 2003/0058907 | A1 | 3/2003 | Nasu et al. |
| 2003/0142712 | A1 | 7/2003 | Ikeda et al. |
| 2004/0196877 | A1 * | 10/2004 | Kawakami et al. ......... 372/23 |
| 2004/0238966 | A1 | 12/2004 | Bottner et al. |

FOREIGN PATENT DOCUMENTS

| DE | 4139833 | 6/1993 |
| DE | 10309677 | 9/2004 |
| EP | 06256185 | 3/2007 |
| JP | 06308557 | 11/1994 |
| JP | 2000031575 | 1/2000 |
| JP | 2000299524 | 10/2000 |

OTHER PUBLICATIONS

Electus Distribution Reference Data Sheet, Electus Distribution, "Leds and Laser Diodes," pp. 1-3, 2001.
L.A. Johnson, "Controlling Temperatures of Diode Lasers Thermoelectrically," Application Note, ILX Lightwave, 11 pages, 2003.

* cited by examiner

*Primary Examiner*—Minsun Harvey
*Assistant Examiner*—Michael Carter
(74) *Attorney, Agent, or Firm*—Ryan, Mason & Lewis, LLP

(57) ABSTRACT

An optical assembly comprises a first semiconductor optical device and a second semiconductor optical device. The first and second semiconductor optical devices may, for example, be laser diodes or light-emitting diodes. In addition, the optical assembly includes an active cooling device that is in thermal contact with the first and second semiconductor optical devices. Advantageously, the active cooling device is operative to regulate the temperatures of both the first and second semiconductor optical devices.

18 Claims, 3 Drawing Sheets

OPTICAL ASSEMBLY COMPRISING MULTIPLE SEMICONDUCTOR OPTICAL DEVICES AND AN ACTIVE COOLING DEVICE

FIELD OF THE INVENTION

This invention relates generally to semiconductor optical devices and, more particularly, to cooling techniques for use in an optical assembly comprising multiple semiconductor optical devices.

BACKGROUND OF THE INVENTION

Semiconductor optical devices (SODs), such as laser diodes and light-emitting diodes, are currently found in a wide variety of applications including consumer electronics and fiber optic communication systems. Nevertheless, in many applications, the implementation of SODs is made significantly more complex by the fact that an SOD's operating characteristics will vary considerably with temperature. For example, emission wavelength, threshold current and operating lifetimes of laser diodes are all strong functions of temperature. For a typical laser diode generating 3 mW of light output at a wavelength of 780 nm, the wavelength will shift an average of 0.26 nm/° C. and the threshold current will shift an average of 0.3 mA/° C. In addition, the operating lifetime drops by a factor of two for every 25° C. rise in operating temperature.

Thermoelectric coolers (TECs) are a type of active cooling device that provide a simple and reliable solution to precise temperature control in many applications involving SODs. A TEC may, for example, be capable of heating or cooling a small thermal load such as a laser diode by greater than 60° C. from ambient temperature, while at the same time achieving temperature stabilities of better than 0.001° C. A TEC typically comprises a cold thermally conductive plate and a hot thermally conductive plate. In order to regulate the temperature of an SOD, the SOD is placed in thermal contact with the cold thermally conductive plate, usually via a thermally conductive material like copper. Within the TEC, heat is transferred from the cold thermally conductive plate to the hot thermally conductive plate by passing current through dozens of thermoelectric cooling couples that span the space between the thermally conductive plates. Each of the thermoelectric cooling couples, in turn, comprises two heavily doped semiconductor blocks (usually formed of bismuth telluride) which are connected electrically in series. In this configuration, the rate of heat transfer from the cold thermally conductive plate to the hot thermally conductive plate is typically proportional to the current passing through the thermoelectric cooling couples and the number of thermoelectric cooling couples forming the TEC.

Unfortunately, however, every active cooling device such as a TEC adds to the cost of implementing an SOD while at the same time consuming valuable space within the electronic apparatus containing the SOD. Moreover, these detrimental aspects are further amplified in modern electronic apparatus comprising more than one SOD. Such multi-SOD electronic apparatus may include, for example, optical storage drives comprising multiple laser diodes capable of handling some combination of compact disc (CD), digital versatile disc (DVD), Blu-Ray and high definition DVD (HD-DVD) optical disc formats. Conventionally, each laser diode in such an application would require its own active cooling device.

As a result, there is a need for an optical assembly comprising multiple SODs wherein temperature regulation is provided by just a single active cooling device.

SUMMARY OF THE INVENTION

The present invention addresses the above-identified need by providing an optical assembly for use in applications requiring multiple SODs. Advantageously, embodiments of this optical assembly only use a single active cooling device for the temperature regulation of multiple SODs rather than having one active cooling device per SOD. Cost and space are thereby conserved.

In accordance with an aspect of the invention, an optical assembly comprises a first SOD and second SOD. In addition, the optical assembly includes an active cooling device that is in thermal contact with the first and second SODs. The active cooling device is operative to regulate the temperatures of both the first and second SODs.

In accordance with another aspect of the invention, an electronic apparatus includes an optical assembly and a controller. The optical assembly comprises a first SOD, a second SOD and an active cooling device. The controller is operative to cause the active cooling device to regulate the temperatures of both the first and second SODs.

In an illustrative embodiment, an optical assembly comprises two laser diodes which are mounted on respective mounts. A TEC, the operation of which is controlled by a controller, lies between and in thermal contact with these mounts. Only one laser diode emits (i.e., actively generates light radiation) at any given time. While one laser diode is emitting, the controller causes the TEC to transfer heat away from that emitting laser diode and into the mount associated with the opposing laser diode that is currently not emitting. During this heat transfer, the mount associated with the non-emitting laser diode acts as a heat sink for the emitting laser diode. When the laser diode that is currently emitting ceases actively generating light radiation and the other laser diode begins to emit, the controller alters the direction of current flow in the TEC, thereby causing the heat transfer in the TEC to change direction. The newly emitting laser diode is then cooled by the TEC. Advantageously, in this way, a single TEC is operative to regulate the temperatures of multiple laser diodes.

These and other features and advantages of the present invention will become apparent from the following detailed description which is to be read in conjunction with the accompanying figures.

DETAILED DESCRIPTION OF THE INVENTION

This invention will be described herein in conjunction with illustrative embodiments comprising optical assemblies having multiple SODs. It should be understood, however, that the invention is not limited to the particular elements and configurations shown and described herein. Modifications to the illustrative embodiments will become apparent to those skilled in the art.

For example, the term "semiconductor optical device," as used herein, is intended to encompass any semiconductor device capable of actively generating light radiation, whether that light radiation be coherent or not. This category of optical device includes, but is not limited to, laser diodes and light-emitting diodes. Therefore, while the particular illustrative embodiments presented herein describe optical assemblies comprising laser diodes, the scope of the invention is not limited to optical assemblies with this particular type of SOD.

Moreover, the term "active cooling device," as used herein, is intended to encompass any powered device that is operative to cool a semiconductor device when placed in thermal contact with that semiconductor device. This category of device includes, for example, cooling devices that operate based on thermoelectric effects, phase-change heat removal or thermionic emission. Moreover, cooling devices comprising micromachined synthetic jets or nozzles and channels that act as micro-circulators of air or fluid would also fall within this category of device. Consequently, while the particular illustrative embodiments presented herein describe optical assemblies comprising TECs, the scope of the invention is not limited to optical assemblies with this particular type of active cooling device.

The term "emitting" as used herein is intended to describe a state wherein an SOD is actively generating light radiation.

Many of the illustrative embodiments described herein involve the formation and operation of SODs. Both the formation of SODs and their operation will be familiar to one skilled in the art. In addition, the formation and operation of SODs are described in a number of commonly available references, such as, P. Holloway et al., *Handbook of Compound Semiconductors*, William Andrews Inc., 1996, and E. Kapon, *Semiconductor Lasers II*, Elsevier, 1998, which are incorporated herein by reference. As a result, these aspects of the invention will not be described in greater detail herein except where these aspects are associated with temperature regulation of SODs by an active cooling device.

It should be understood that the various elements shown in the accompanying figures may not be drawn to scale, and that one or more elements commonly used in such optical assemblies may not be explicitly shown in a given figure for ease of explanation. This does not imply that those elements that are not explicitly shown are omitted from the actual optical assembly.

Figure 1A:
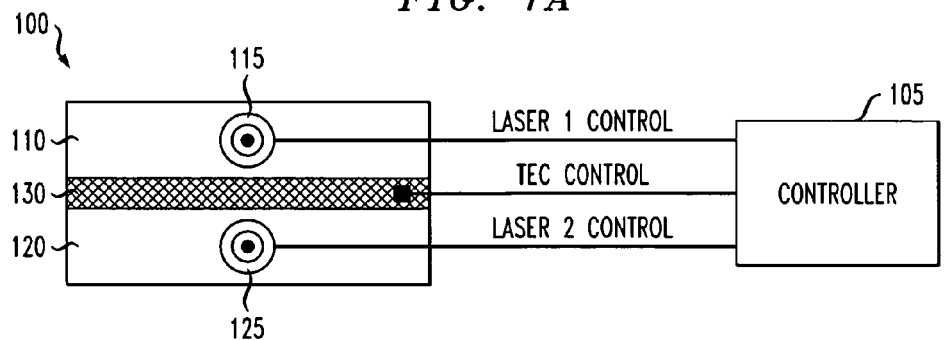
FIG. 1A shows an optical assembly in accordance with an illustrative embodiment of the invention and its connections to a controller.

FIG. 1A shows an illustrative optical assembly 100 as well as an associated controller 105 and its signal connections. The optical assembly comprises two SODs, namely, an upper laser diode 115 and a lower laser diode 125. The upper laser diode is mounted on an upper mount 110 and the lower laser diode is mounted on a lower mount 120. A TEC 130 lies between the upper and lower mounts. The controller is electrically connected to the laser diodes and the TEC via the signal connections so that the controller can send and receive control signals from these various elements.

Figure 1B:
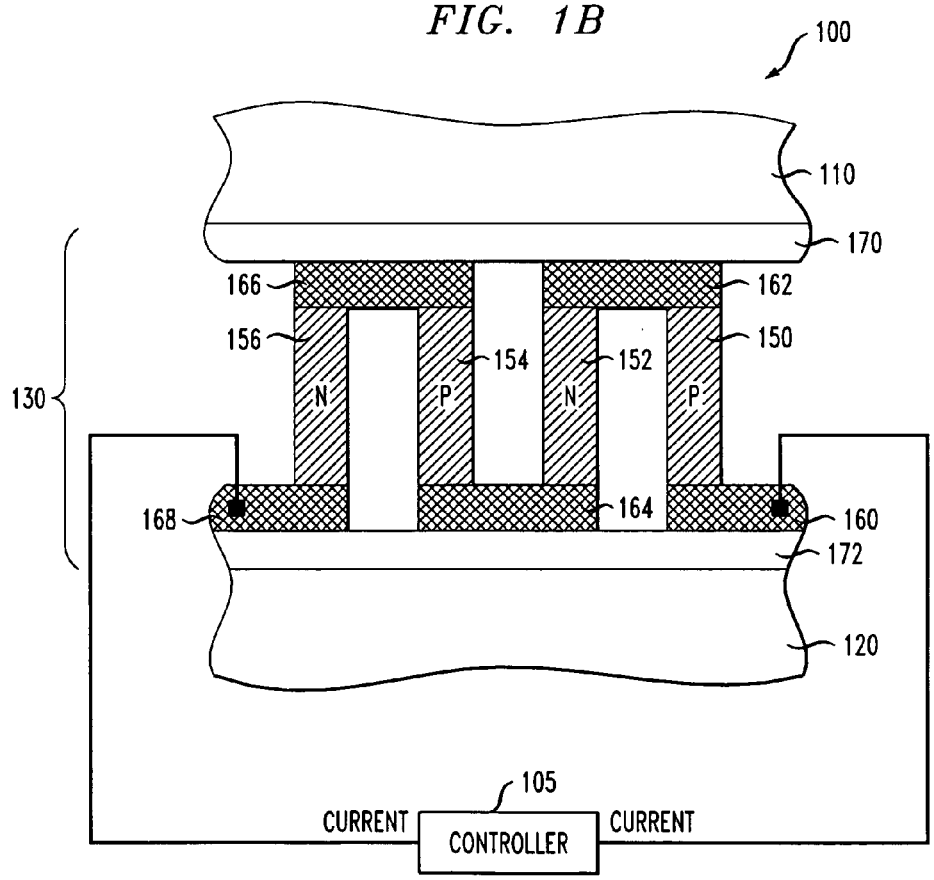
FIG. 1B shows a portion of the FIG. 1A optical assembly and its connections to a controller.

FIG. 1B helps to detail the elements forming the TEC 130. A portion of FIG. 1B shows a magnified sectional view of the optical assembly 100 in the region where the TEC meets the upper and lower mounts 110, 120. The illustrated portion of the TEC comprises doped semiconductor blocks 150, 152, 154 and 156. The semiconductor blocks are connected together in series using upper electrical conductors 162 and 166, and lower electrical conductors 160, 164 and 168. An upper thermally conductive plate 170 lies above and in thermal contact with the upper electrical conductors. Likewise, a lower thermally conductive plate 172 lies below and in thermal contact with the lower electrical conductors.

Figure 2:
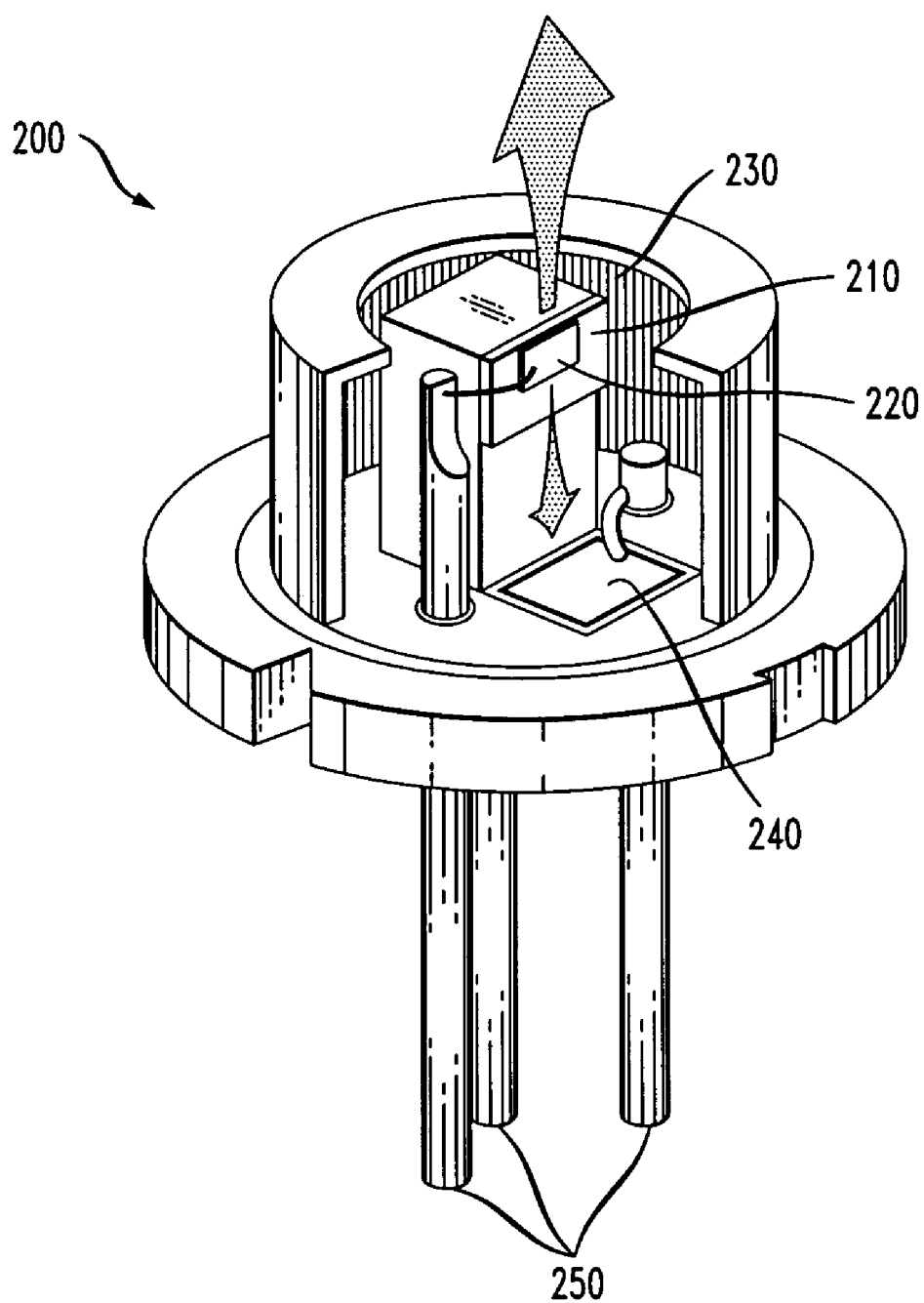
FIG. 2 shows an illustrative laser diode comprising a can-type laser diode package with the laser diode package partially cut away.

Laser diodes 115, 125 in FIG. 1A are shown to comprise can-type laser diode packages. Can-type laser diode packages are common for laser diodes with output powers of less than 1 W. FIG. 2 shows a perspective view of a laser diode 200 comprising a typical can-type laser diode package. The can-type laser diode package includes a small heat sink 210 onto which a laser diode chip 220 is mounted. The light emitted from the laser diode chip is transmitted out of the laser diode package through a small window 230. The can-type laser diode package further comprises a monitoring photodiode 240 for measuring light output and pins 250 for electrically interfacing to the laser diode. However, it should be noted that a laser diode need not comprise a certain type of laser diode package to fall within the scope of this invention. Other suitable laser diode packages will be familiar to one skilled in the art. These other types of laser diode packages may include, for example, frame-type, dual-in-line and butterfly packages.

The portion of the TEC 130 shown in FIG. 1B operates by utilizing what is commonly referred to as the Peltier effect. To achieve cooling, the semiconductor blocks 150 and 154 are heavily doped with acceptor impurities so that these semiconductor blocks become strongly P-type. In contrast, the remaining semiconductor blocks, 152 and 156, are heavily doped with donor impurities so that these semiconductor blocks become strongly N-type. The controller 105 is then utilized to flow current through the semiconductor blocks via the electrical conductors 160, 162, 164, 166, 168. When current is passed through the semiconductor blocks from right to left in relation to FIG. 1B, heat is absorbed by electrons as they transition from a lower energy level in the P-type semiconductor blocks 150, 154 to a higher energy level in the N-type semiconductor blocks 152, 156. Correspondingly, heat is released when electrons transition from the higher energy level in the N-type semiconductor blocks to the lower energy level in the P-type semiconductor blocks. These dynamics have the effect of cooling the upper electrical conductors 162, 166 while at the same time heating the lower electrical conductors 160, 164, 168. The TEC thereby becomes a solid-state heat pump that effectively transfers thermal energy from the upper thermally conductive plate 170 to the lower thermally conductive plate 172.

Figure 3:
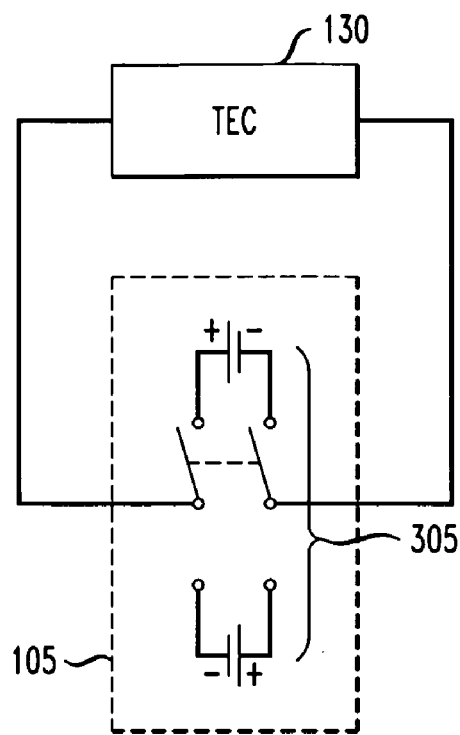
FIG. 3 shows a switch component within the FIG. 1A controller and its connections to a TEC.

Advantageously, the direction of heat transfer in the TEC 130 can be reversed simply by changing the direction of current flow. The controller 105 is thereby capable of making either one of the thermally conductive plates 170 or 172 the cold side of the TEC at any given time. One skilled in the electronics art will recognize how an electronic device like the controller 105 can be configured to switch the direction of current flow in the TEC. The direction of current flow in the TEC can, as just one example, be switched by incorporating a double-pole-double-throw (DPDT) switch or its solid-state equivalent within the controller. FIG. 3 shows an illustrative DPDT switch 305 within the controller tied to two voltage sources that are reversed in polarity with respect to one another. Actuating the DPDT switch reverses the direction of current flowing in the TEC.

Each adjacent pair of oppositely doped semiconductor blocks, 150 and 152, and 154 and 156, forms what is commonly referred to as a thermoelectric cooling couple. In the configuration shown in FIG. 1B, the rate of heat transfer from one thermally conductive plate, 170 or 172, to the other thermally conductive plate is typically proportional to the current passing through the TEC and the number of thermoelectric cooling couples forming the TEC. Therefore, while only two thermoelectric cooling couples are shown in FIG. 1B for illustrative purposes, the cooling capacity of the TEC 130 would preferably be made greater by incorporating many more thermoelectric cooling couples between the thermally conductive plates.

The doped semiconductor blocks 150, 152, 154, 156 in the TEC 130 will preferably comprise bismuth telluride or lead telluride, although other suitable materials can be used. The electrical conductors 160, 162, 164, 166, 168 preferably comprise an electrically and thermally conductive metal such as, but not limited to, copper, gold, silver or aluminum. The thermally conductive plates 170, 172 preferably comprise a material that is a good thermal conductor but is an electrical insulator, such as a ceramic. By having the thermally conductive plates comprise an electrically insulating ceramic, the temperatures of the upper and lower mounts 110, 120 can be regulated by the TEC without transferring a voltage to these mounts.

The regulation of the temperatures of both laser diodes 115, 125 within the FIG. 1A optical assembly 100 can now be further detailed. As described earlier, the laser diodes are mounted to the respective mounts 110, 120. This attachment should be such that heat produced by the laser diodes is readily transferred to the mounts. In accordance with an aspect of the invention, the mounts are formed of thermally conductive metal. The mounts could, for example, comprise, copper, gold, silver or aluminum. Each of the mounts is, in turn, attached to a different one of the thermally conductive plates 170, 172 of the TEC 130. In this way, the mounts are operative to transfer heat from the laser diodes to the TEC.

In operation, the FIG. 1A optical assembly 100 preferably functions such that only one of the two laser diodes 115, 125 emits at any given time. Because only one laser diode is producing heat at any given time, the controller 105 may regulate the TEC 130 such that the heat is always transferred away from the currently emitting laser diode. When one laser diode ceases emitting and the other starts, the controller responds by switching the direction of current flow in the TEC so that the newly emitting laser diode is subsequently cooled. The controller thereby toggles the direction of thermal transfer in the TEC in response to which one of the laser diodes is currently emitting and, correspondingly, producing heat.

While the TEC 130 is transferring heat away from the emitting laser diode, 115 or 125, the opposing mount associated with the currently non-emitting laser diode, 120 or 110 respectively, acts as a heat sink for the heat transferred by the TEC. For example, while the upper laser diode 115 is emitting, the lower mount 120 acts as a heat sink for that heat transferred by the TEC. Accordingly, in addition to comprising a thermally conductive metal, the mounts will also preferably be configured to enhance heat absorption and dissipation by conduction, radiation and convection. This can be accomplished in various ways which will be familiar to one skilled in the art. The mounts will preferably, for example, comprise a polished flat surface where they physically contact the thermally conductive plates 170, 172 of the TEC.

Additionally and optionally, if the demand for thermal dissipation is great enough, the mounts 110, 120 may comprise an array of comb or fin like protrusions to increase the surface contact of the mounts with the surrounding air. Such cooling fins will substantially enhance thermal dissipation by convection and, to some extent, radiation. Moreover, an electric fan may optionally be employed to blow air over the mounts. A forced air system will increase the rate of airflow over the mounts and, as a result, create a greater temperature gradient between the mounts and the air immediately next to the mounts. Convective heat transfer will thereby be enhanced, especially in those configurations wherein the mounts comprise cooling fins.

It should be recognized that, in addition to toggling the direction of current flowing through the TEC 130 in response to which of the two laser diodes 115, 125 is presently emitting, the controller 105 will preferably also regulate the amount of current flowing in the TEC in response to the temperature of the currently emitting laser diode in order to maintain a predetermined operating temperature. Such temperature regulation is conventionally performed by TECs and controllers in conjunction with laser diodes and, as a result, will be familiar to one skilled in the art.

In the optical assembly 100, temperature regulation can be established by forming an electronic feedback loop between the laser diodes 115, 125, the TEC 130 and the controller 105 using the signal connections shown in FIG. 1A. The actual temperature of the emitting laser diode is measured by a thermistor that is incorporated into its laser diode package or onto its mount. This thermistor signal, which is typically in the form of a resistance value, is transmitted to the controller wherein a microprocessor performs a resistance-to-temperature conversion using, for example, the Steinhart-Hart equation. The calculated temperature is then compared to a predetermined set-point operating temperature for the emitting laser diode. This comparison produces an error signal proportional to the difference in temperature between the actual laser diode temperature and the set-point operating temperature. Circuitry within the controller then modifies the current flowing through the TEC in proportion to this error signal. If the emitting laser diode is operating at a temperature higher than the set-point operating temperature, the controller increases the current flowing through the TEC so that the heat transfer rate of the TEC is increased. If the emitting laser diode is operating at a temperature lower than the set-point operating temperature, the controller decreases the current flowing through the TEC so that the heat transfer rate of the TEC is decreased.

As described earlier, aspects of the present invention will be useful in those electronic apparatus that comprise an optical assembly having multiple SODs. Such electronic apparatus will be apparent to one skilled in the art. An example would include an optical storage drive comprising multiple laser diodes for the purpose of recording and playing back in accordance with multiple optical disc formats such as Blu-ray, DVD and CD. Blu-ray is a relatively new optical disc format capable of recording and playing back high definition content from, for instance, high definition broadcasting. Laser diodes for Blu-ray applications typically emit at a wavelength of 405 nm. Laser diodes for DVD and CD applications typically emit at wavelengths of 660 nm and 785 nm, respectively. Additional electronic apparatus for which this invention will be useful would include fiber optic transmitters containing multiple SODs for use in fiber optic communication systems.

Moreover, aspects of the present invention may be useful in an assembly comprising two non-optical semiconductor devices. For example, an assembly similar to that shown in FIG. 1A may comprise two integrated circuits placed in thermal contact with opposing sides of a single TEC via a pair of thermally conductive mounts onto which the integrated circuits are mounted. As in the case of laser diodes 115, 125, each integrated circuit would preferably only operate at different times with respect to one another. Accordingly, in a way similar to that described above, such a configuration would allow a single TEC to be operative to regulate temperatures of both of the integrated circuits.

Figure 4:
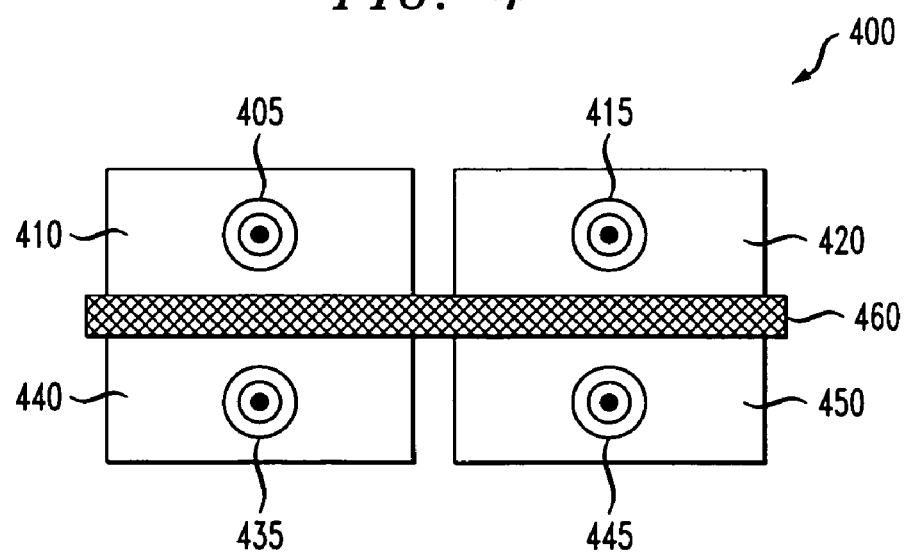
FIG. 4 shows an optical assembly comprising four laser diodes in accordance with another illustrative embodiment of the invention.

FIG. 4 shows another illustrative embodiment of an optical assembly in accordance with aspects of the invention. In this embodiment, the optical assembly 400 comprises four laser diodes. Upper laser diodes 405 and 415 are mounted to upper mounts 410 and 420, respectively, while lower laser diodes 435 and 445 are mounted to lower mounts 440 and 450, respectively. A single TEC 460 is located between the upper and lower mounts. As before, the laser diodes and the TEC are each electrically connected to a controller, not shown in the figure.

Advantageously, the single TEC 460 is operative to cool all four laser diodes 405, 415, 435, 445, thereby saving cost and space. As before, this is accomplished in part by preferably constraining the laser diodes such that only one laser diode emits at any given time. In this way, the controller can toggle the TEC such that it transfers the heat produced by the emitting laser diode away from that laser diode and into the mounts associated with the non-emitting laser diodes that are located on the opposing side of the TEC. For example, if the upper laser diode 405 is presently emitting, the TEC would transfer the generated heat from the upper mount 410 to the lower mounts 440 and 450. The direction of heat transfer would be reversed if either one of the lower laser diodes were to begin emitting.

Also as before, the controller, in addition to toggling the direction of current flow in the TEC, would preferably also regulate the amount of current flowing in the TEC in response to the temperature of the currently emitting laser diode in order to maintain a predetermined operating temperature. This is accomplished by establishing an electronic feedback loop similar to that described above.

Importantly, it is to be understood that, although illustrative embodiments of the present invention have been described herein with reference to the accompanying figures, the invention is not limited to those precise embodiments. For example, an optical assembly may comprise entirely different types of SODs and active cooling devices from those described in the illustrative embodiments and still come within the scope of the invention. Also, the particular mounting structures, controller circuitry and other characteristics may be varied in other embodiments. One skilled in the art will recognize various other changes and modifications that may be made without departing from the scope of the appended claims.

What is claimed is:

1. An optical assembly comprising:
   an active cooling device having an upper surface and a lower surface opposite the upper surface;
   a first semiconductor optical device mounted on the upper surface of the active cooling device; and
   a second semiconductor optical device mounted on the lower surface of the active cooling device;
   the active cooling device thereby being disposed between the first and second semiconductor optical devices;
   wherein the active cooling device is configured to regulate temperatures of both the first and second semiconductor optical devices by transferring heat between the upper and lower surfaces.

2. The optical assembly of claim 1, wherein at least one of the first and second semiconductor optical devices is a laser diode.

3. The optical assembly of claim 1, wherein at least one of the first and second semiconductor optical devices is a light-emitting diode.

4. The optical assembly of claim 1, wherein at least one of the first and second semiconductor optical devices is a laser diode comprising a can-type laser diode package.

5. The optical assembly of claim 1, wherein the first and second semiconductor optical devices only emit at different times in relation to one another.

6. The optical assembly of claim 1, wherein the active cooling device transfers heat from the upper surface to the lower surface while the first semiconductor optical device is emitting and transfers heat from the lower surface to the upper surface while the second semiconductor optical device is emitting.

7. The optical assembly of claim 1, wherein at least one of the first and second surfaces comprises copper, silver, gold or aluminum, or a combination thereof.

8. The optical assembly of claim 1, further comprising a third semiconductor optical device mounted on the upper surface and a fourth semiconductor optical device mounted on the lower surface.

9. The optical assembly of claim 1, wherein the active cooling device comprises a thermoelectric cooler.

10. The optical assembly of claim 9, wherein a controller is operative to pass current through at least a portion of the thermoelectric cooler.

11. The optical assembly of claim 10, wherein the controller regulates the current passing through at least a portion of the thermoelectric cooler in response to the temperature of at least one of the first and second semiconductor optical devices.

12. The optical assembly of claim 1, wherein the active cooling device provides cooling at least in part by circulating air or fluid, or a combination thereof.

13. The optical assembly of claim 1, wherein the optical assembly comprises three or more semiconductor optical devices.

14. An assembly comprising:
   an active cooling device having an upper surface and a lower surface opposite the upper surface;
   a first semiconductor device mounted on the upper surface of the active cooling device; and
   a second semiconductor device mounted on the lower surface of the active cooling device;
   the active cooling device thereby being disposed between the first and second semiconductor optical devices;
   wherein the active cooling device is configured to regulate temperatures of both the first and second semiconductors devices by transferring heat between the upper and lower surfaces.

15. An electronic apparatus including an optical assembly and a controller, the optical assembly comprising an active cooling device having an upper surface and a lower surface opposite the upper surface; a first semiconductor optical device mounted on the upper surface of the active cooling device; and a second semiconductor optical device mounted on the lower surface of the active cooling device; the active cooling device thereby being disposed between the first and second semiconductor optical devices; wherein the active cooling device is configured to regulate temperatures of both the first and second semiconductor optical devices by transferring heat between the upper and lower surfaces.

16. The electronic apparatus of claim 15, wherein the electronic apparatus comprises an optical storage drive.

17. The electronic apparatus of claim 15, wherein the electronic apparatus comprises an optical storage drive capable of recording data in accordance with at least two different optical disc formats.

18. The electronic apparatus of claim 15, wherein the electronic apparatus is a component of a fiber optic communication system.

* * * * *